(12) United States Patent
Nomura et al.

(10) Patent No.: US 6,700,508 B1
(45) Date of Patent: Mar. 2, 2004

(54) THIN KEYBOARD UNIT CAPABLE OF MAKING LARGE THE STROKE OF A KEY TOP

(75) Inventors: Hiroo Nomura, Fukushima-ken (JP); Yuichi Yasuda, Fukushima-ken (JP); Yoshihisa Endo, Fukushima-ken (JP)

(73) Assignee: Alps Electronic Co., Ltd., Tokyo (JP)

( * ) Notice: Subject to any disclaimer, the term of this patent is extended or adjusted under 35 U.S.C. 154(b) by 0 days.

(21) Appl. No.: 09/524,470

(22) Filed: Mar. 13, 2000

(30) Foreign Application Priority Data

Mar. 15, 1999 (JP) .......................................... 11-069139

(51) Int. Cl.[7] .............................................. H03K 17/96
(52) U.S. Cl. ............................. 341/27; 341/22; 341/34
(58) Field of Search ............................. 200/5 A, 344, 200/513; 340/407.2, 384.5; 310/339, 342, 317, 318, 311; 341/27, 22, 34

(56) References Cited

U.S. PATENT DOCUMENTS

| | | | | |
|---|---|---|---|---|
| 4,412,210 A | * | 10/1983 | Washizuka et al. | 340/384.5 |
| 4,521,712 A | * | 6/1985 | Braun et al. | 310/339 |
| 4,677,600 A | * | 6/1987 | Yoshida | 367/127 |
| 4,857,887 A | * | 8/1989 | Iten | 200/5 A |
| 4,975,616 A | * | 12/1990 | Park | 310/339 |
| 5,189,390 A | * | 2/1993 | Fagard | 340/407.2 |
| 5,212,473 A | * | 5/1993 | Louis | 200/513 |
| 5,850,194 A | * | 12/1998 | Lin | 200/344 |
| 5,982,304 A | * | 11/1999 | Selker et al. | 200/5 A |

FOREIGN PATENT DOCUMENTS

JP       5-182559       7/1993

\* cited by examiner

*Primary Examiner*—Michael Horabik
*Assistant Examiner*—Hung Dang
(74) *Attorney, Agent, or Firm*—Brinks Hofer Gilson & Lione

(57) ABSTRACT

A keyboard unit capable of making large the stroke of a key top and a sure click touch. In one aspect of the invention, the keyboard unit of the present invention comprises an elastic material such as a domed reversible return spring. In another aspect, a predetermined space is formed between a piezoelectric element and the base plate. The piezoelectric elements may extend underneath two support bodies from a first support body to a second support body. Each membrane switch and the return spring is depressed and reversed by a stem, wherein each of the piezoelectric elements is driven through the contact point of the respective membrane switch. The resulting driving force is transmitted to the respective key top through the stem. The stem is then elastically deformed and contracted by the inertia force pressing the key top to produce the stroke of the key top.

19 Claims, 2 Drawing Sheets

THIN KEYBOARD UNIT CAPABLE OF MAKING LARGE THE STROKE OF A KEY TOP

BACKGROUND OF THE INVENTION

1. Field of the Invention

The present invention relates to a keyboard unit and, particularly, to a keyboard unit suitable for use in a keyboard input device.

2. Description of the Related Art

A keyboard unit for a keyboard generally comprises a housing, membrane switches, each having upper and lower electrodes which are incorporated in this housing and opposed to each other with a predetermined space therebetween, key tops, each supported by lifting units in such a manner that it can move vertically with respect to the housing, and rubber springs each of which is arranged below each key top and can be elastically deformed.

As for the operation of this keyboard unit, when the key top is moved down in defiance of the elastic force of the rubber spring by depressing, the rubber spring is reversed in the course of the movement of the key top to generate a click touch and the membrane switch is turned on.

When the above pressure applied to the key top is removed, the key top supported by the lifting units rises by the return force of the reversed rubber spring and the membrane switch is returned to an OFF state in the course of the movement of the key top.

In recent years, demand for a thin keyboard unit has been becoming greater and greater along with the popularization of notebook-sized small and thin portable personal computers. However, a conventional keyboard unit having the above lifting units has limitation in reducing its thickness because the height of the rubber spring becomes higher than required to generate a click touch.

It is therefore an object of the present invention to provide a keyboard unit which can make an operator feel a large stroke of a key top and can give a sure click touch though it is thin.

SUMMARY OF THE INVENTION

According to a first aspect of the present invention, there is provided a keyboard unit which comprises key tops, membrane switches whose contact points are changed by depressing the key tops, piezoelectric elements which can be curved and deformed by the application of voltage and a base plate for mounting the piezoelectric elements, wherein each of the piezoelectric elements is driven by changing the contact point of the respective membrane switch and this driving is transmitted to the respective key top through a stem.

According to a second aspect of the present invention, there is provided a keyboard unit wherein a domed reversible return spring is interposed between each key top and each membrane switch and depressed and reversed by depressing the key top to change the contact point of the membrane switch.

According to a third aspect of the present invention, there is provided a keyboard unit wherein a stem made of an elastic material is provided on the rear of each key top and elastically deformed and contracted by depressing the key top after the return spring is reversed by depressing the key top with the stem.

According to a fourth aspect of the present invention, there is provided a keyboard switch wherein the piezoelectric element is arranged to form a predetermined space below the membrane switch and bent toward the space when the contact point of the membrane switch is changed by depressing the key top.

According to a fifth aspect of the present invention, there is provided a keyboard unit wherein the space is formed by a spacer arranged between the piezoelectric element and the base plate or a recess formed in a portion where at least the center portion of the piezoelectric element of the base plate is located.

BRIEF DESCRIPTION OF THE ACCOMPANYING DRAWINGS

DETAILED DESCRIPTION OF THE PREFERRED EMBODIMENTS

Figure 1:
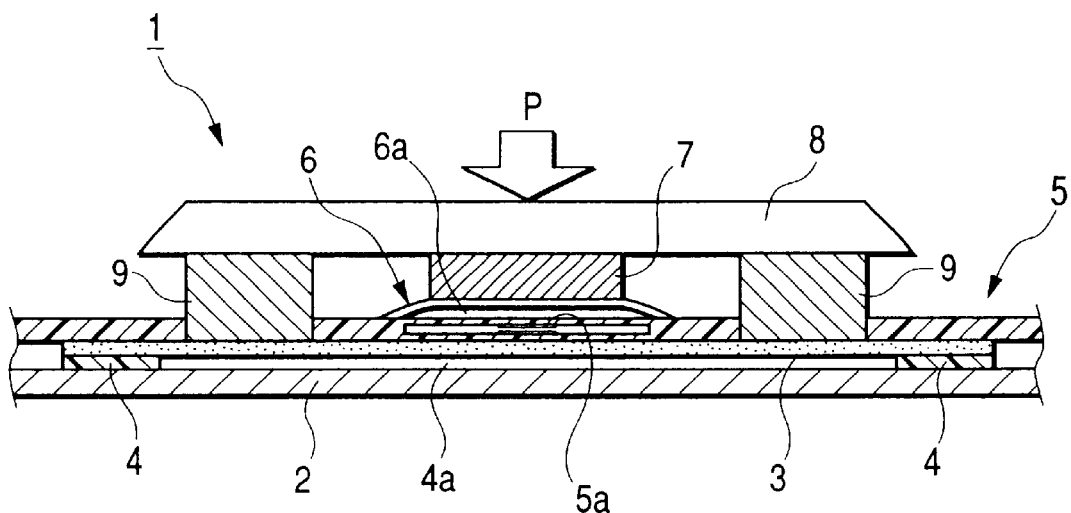
FIG. 1 is a sectional view of key parts of the keyboard unit of the present invention.
Figure 2:
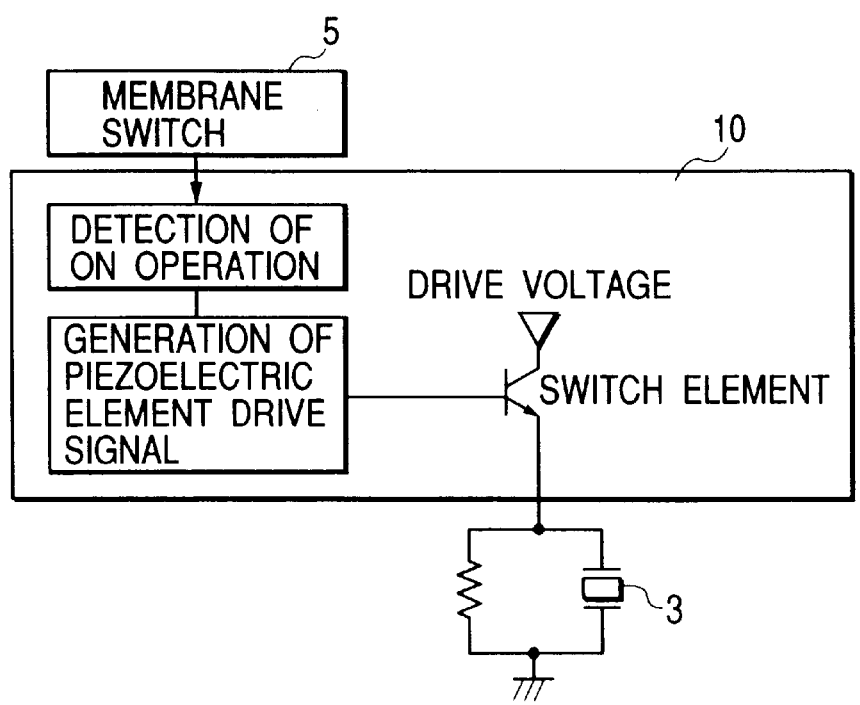
FIG. 2 is a schematic diagram showing the control circuit of a piezoelectric element according to the present invention.
Figure 3:
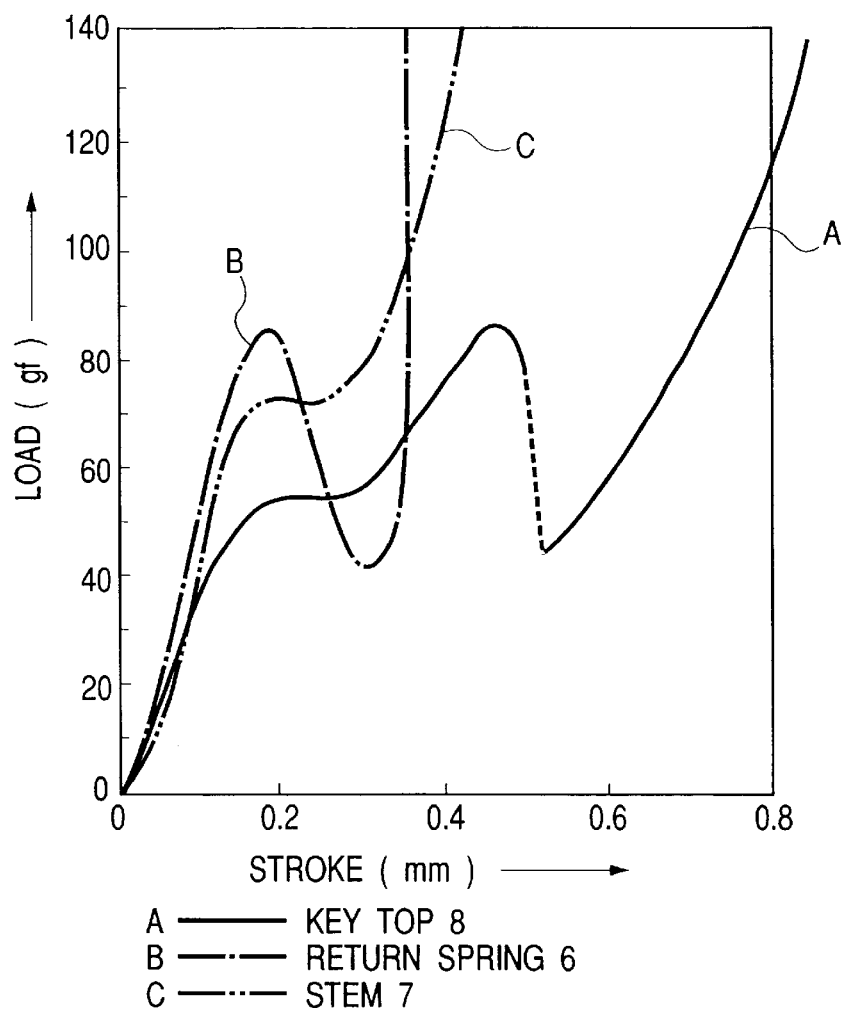
FIG. 3 is a graph showing the relationship between the stroke of the key top and pressure according to the present intention.
Figure 4:
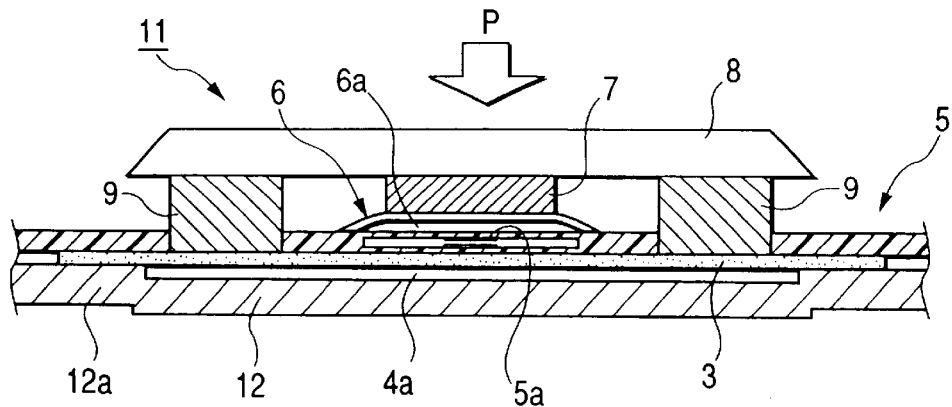
FIG. 4 is a sectional view of key parts of another embodiment of the present invention.

A keyboard unit according to a first embodiment of the present invention will be described with reference to the accompanying drawings. FIG. 1 is a sectional view of key parts of the keyboard unit of the present invention, FIG. 2 is a schematic diagram showing the control circuit of a piezoelectric element according to the present invention, FIG. 3 is a graph showing the relationship between the pressure load and stroke of a key top according to the present invention, and FIG. 4 is a sectional view of key parts of another embodiment of the present invention.

As shown in FIG. 1, a flat base plate 2 made of a metal plate such as aluminum is arranged at a lower end portion of the keyboard unit 1 of the present invention. A plurality of piezoelectric elements 3 are placed on this base plate 2 and can be driven by a piezoelectric control circuit 10 which will be described hereinafter such that at least the center portion of each of the piezoelectric elements 3 formed on the base plate expands and is curved and deformed like an arm.

A plurality of spacers 4 are interposed between the piezoelectric elements 3 and the base plate 2 to form a predetermined space 4a between the piezoelectric elements 3 and the base plate 2.

The spacers 4 are made of an insulating material having a predetermined thickness and attached to the under surface of the peripheral portion of each of the piezoelectric elements 3 by an adhesive or the like.

Film-form membrane switches 5 are arranged on the piezoelectric elements 3. Each of the membrane switches 5 has electrodes 5a which are located at a plurality of positions of the film-form member and opposed to each other with a predetermined space therebetween. The opposed electrodes 5a are situated at least on the center portion of the piezoelectric element 3.

The contact point of the membrane switch 5 is changed by contacting or separating the opposed electrodes 5a by the depression operation of the electrodes 5a from the outside.

A domed return spring 6 which is made of an elastic material such as a leaf spring and can reverse its direction is placed on the electrodes 5a and a predetermined space 6a is formed between the front surface of the membrane switch 5 and the top portion on the inner side of the return spring 6.

The return spring 6 is reversed by depressing the top portion of the return spring 6 to generate a click touch and to contact the opposed electrodes 5a of the membrane switch 5 to each other so as to change the contact point.

The outer side of the domed top portion of the return spring 6 is located right below a stem 7. The return spring 6 may be bonded to the stem 7.

That is, the return spring 6 can be reversed by the depression operation of a key top 8 which will be described hereinafter or returned to its initial domed shape from the reversed state.

The above stem 7 is made of a foamed elastic material such as silicone rubber and the elastic force of this stem is set equal to the elastic force of the return spring 6.

The substantially rectangular key top 8 is situated on the top of the stem 7 and the stem 7 is attached to substantially the center portion of the key top 8 by an adhesive or the like.

Support bodies 9 made of an elastic material for supporting the key top 8 in such a manner that it can move vertically are fixed to the peripheral portions of the key top 8 on right and left sides of the stem 7. The elastic force of the support bodies 9 is set smaller than that of the stem 7 to prevent pressure applied to the key top 8 from becoming large.

The piezoelectric element 3 is controlled by the piezoelectric element control circuit 10 as shown in FIG. 2. When the membrane switch 3 is turned on by the depression operation of the key top 8, the piezoelectric element control circuit 10 detects this ON operation and generates a drive signal for driving the piezoelectric element 3. A switch element incorporated in the piezoelectric element control circuit 10 is controlled by this drive signal to apply predetermined drive voltage to the piezoelectric element 3.

When the predetermined drive voltage is applied to the piezoelectric element, at least the center portion of the piezoelectric element 3 expands so that it can be curved and deformed like an arm in a vertical direction.

The piezoelectric element 3 curves its center portion like an arm to lift it up, whereby the membrane switch 5 and the return spring 6 above the piezoelectric element 3 are moved up to generate a click touch which is transmitted to the depressed key top 8 through the stem 7. The click touch may be generated by curving and deforming the piezoelectric element 3 downward.

That is, in the keyboard unit of the present invention, a click touch transmitted to the key top 8 is a combination of a click touch generated when the return spring 6 is reversed and a click touch generated when the piezoelectric 3 is driven.

The operation of the keyboard unit constituted as described above is such as shown in FIG. 1 that, when a pressure load P is applied to the key top 8 to depress it, the support bodies 9 are elastically deformed and contracted, the stem 7 moves down to depress the top portion of the return spring 6, and the stem 7 and the return spring 6 are elastically deformed.

When the return spring 6 is elastically deformed a predetermined amount, it reverses its direction, a click touch is generated by the reversal of this return spring 6 and transmitted to the key top 8, the opposed electrodes 5a are contacted to each other by a pressure load P applied to the key top 8, and the contact point of the membrane switch 5 is changed.

When this contact point change signal is detected by the piezoelectric element control circuit 10 shown in FIG. 2, the piezoelectric element control circuit 10 is driven to expand at least the center portion of the piezoelectric element 3 so that it is curved and deformed like an arm, thereby moving up the membrane switch 5 and the return spring 6 above the piezoelectric element 3 to generate a click touch.

This click touch is transmitted to the key top 8 through the stem 7 so that an operator who depresses the key top 8 can feel the click touch.

Even after the contact point of the membrane switch 5 is changed by the reversal of the return spring 6, the piezoelectric element 3 is depressed by the pressure load P applied to the key top 8, at least the center portion of the piezoelectric element 3 is bent toward the space 4a and contacted to the front surface of the base plate 2. Then, the stem 7 is elastically deformed and contracted a predetermined size by inertia force generated by the pressure load P applied to the key top 8.

Since the switch unit of the present invention sets a very short time interval from the time when the key top 8 is depressed to the time when the piezoelectric element 3 is driven, a click touch obtained by the reversal of the return spring 6 and a click touch obtained by the driving of the piezoelectric element 3 are given almost at the same time.

Therefore, click touches transmitted to the operator who depresses the key top 8 can make the operator feel them as a single click touch.

The relationship between pressure load applied to the key top 8, return spring 6 and stem 7 and the stroke of the switch unit 1 of the present invention constituted as described above will be described with reference to the graph of FIG. 3. When a pressure load is applied to the return spring 6 alone to elastically deform it, as shown by curve B, the return spring 6 reverses its direction at a pressure load of about a little less than 90 gf and a stroke of about 0.2 mm and the stroke when this reversal ends is about 0.3 mm.

When a pressure load is applied to the stem 7 alone to deform it, as shown by curve C, the stroke of the key top 8 can be changed up to about 0.4 mm at a pressure load of about 140 gf.

Since the space between the opposed electrodes 5a of the membrane switch 5 is about 0.1 to 0.2 mm, the stroke of the key top 8 of the switch unit 1 of the present invention can be set to 0.8 to 1.0 mm at a pressure load of about 140 gf.

Therefore, the switch unit 1 of the present invention can make the stroke of the key top 8 larger than the stroke of the return spring 6 even when the stroke of the return spring 6 is small at 0.3 mm.

In this embodiment of the present invention, the spacer 4 having a predetermined thickness is used to set the space 4a between the piezoelectric element 3 and the base plate 2. According to another embodiment of the present invention, as shown in FIG. 4, a recess 12a may be formed in a base plate 12 to form the space 4a.

In this embodiment of the present invention, the return spring 6 is used and reversed to generate a click touch and the piezoelectric element 3 is driven to generate another click touch. A click touch may be generated only by driving the piezoelectric element 3 without using the return spring 6. This keyboard unit eliminates the need for the return spring 6, thereby making it possible to reduce the number of parts and reduce costs.

In the keyboard unit of the present invention, the piezoelectric element is driven by changing the contact point of the membrane switch and this driving is transmitted to the key top through the stem. Therefore, when the membrane switch is turned on, a sure click touch can be transmitted to the operator by driving the piezoelectric element and erroneous input into the keyboard unit can be prevented.

A domed return spring which can reverse its direction is interposed between the key top and the membrane switch and depressed and reversed by depressing the key top to change the contact point of the membrane switch. Therefore, two click touches can be generated by driving the piezoelectric element and by reversing the return spring, thereby making it possible to provide a high-performance keyboard unit which can transmit a more sure click touch.

The stem made of an elastic material is provided on the rear of the key top so that it is elastically deformed and contracted by depressing the key top after the return spring is reversed by depressing the key top with this stem. Therefore, the stroke of the key top can be made large by the reversal size of the return spring and by the elastic deformation and contraction of the stem.

When the predetermined space is formed between the piezoelectric element and the base plate and the contact point of the membrane switch is changed by depressing the key top, the piezoelectric element is bent toward the space. Therefore, the piezoelectric element can be bent toward the space and deformed by depressing the key top, thereby making it possible to make the operator feel the large stroke of the key top.

The space is formed by the spacer arranged between the piezoelectric element and the base plate or the recess formed in a portion of the base plate where at least the center portion of the piezoelectric element is located. Therefore, the space can be formed easily and a high-accuracy space can be formed.

What is claimed is:

1. A keyboard unit comprising:
   at least one key top;
   a membrane switch having a contact point, said contact point being changed by depressing the key top;
   a piezoelectric element, deformable by an application of a voltage; and
   a base plate for mounting the piezoelectric element,
   wherein the voltage is applied to the piezoelectric element in response to changing said contact point, a surface of said membrane switch being in contact with a surface of the piezoelectric element after application of the voltage.

2. The keyboard unit of claim 1, wherein a domed reversible return spring is interposed between the key top and the membrane switch and depressed and reversed by depressing the key top to change the contact point of the membrane switch.

3. The keyboard unit of claim 2, wherein a stem made of an elastic material is provided on the rear of each key top and elastically deformed and contracted by depressing the key top after the return spring is reversed by depressing the key top with the stem.

4. The keyboard unit of claim 1, wherein the piezoelectric element is arranged to form a predetermined space below the membrane switch and bent toward the space when the contact point of the membrane switch is changed by depressing the key top.

5. The keyboard unit of claim 4, wherein the space is formed by a spacer arranged between the piezoelectric element and the base plate.

6. The keyboard unit of claim 4, wherein the space is formed by a recess formed in a portion where at least the center portion of the piezoelectric element of the base plate is located.

7. A keyboard unit comprising:
   at least one key top;
   a membrane switch comprising electrodes, said electrodes disposed such that they make a contact closure when the membrane switch is deformed;
   a piezoelectric element, deformable by an application of a voltage; and
   a base plate for mounting the piezoelectric element,
   wherein the voltage is applied to the piezoelectric element in response to the contact closure, and a driving force is transmitted to the key top through a stem.

8. The keyboard unit of claim 7, wherein the stem is made of an elastic material and provided beneath the key top.

9. The keyboard unit of claim 7, wherein the stem is separated from the membrane switch by an elastic material.

10. The keyboard unit of claim 9, wherein the elastic material comprises a domed reversible return spring.

11. The keyboard unit of claim 7, wherein a predetermined space is formed between the piezoelectric elements and the base plate.

12. The keyboard unit of claim 7, wherein the piezoelectric element is arranged to form a predetermined space below the membrane switch and bent toward the space when the key top is depressed.

13. A keyboard unit comprising:
    at least one key top;
    a membrane switch that comprises electrodes separated by a first predetermined space, said electrodes making contact when the membrane switch is deformed;
    a piezoelectric element, deformable by an application of a voltage; and
    a base plate for mounting the piezoelectric element,
    wherein the voltage is applied to the piezoelectric element when the electrodes make contact, and a driving force is transmitted to the key top through a stem.

14. The keyboard unit of claim 13, wherein the stem is made of an elastic material provided beneath the key top.

15. The keyboard unit of claim 13, wherein the stem is elastically deformed after a domed reversible return spring is reversed when the key top is depressed.

16. The keyboard unit of claim 13, wherein the stem is separated from the membrane switch by an elastic material.

17. The keyboard unit of claim 16, wherein the elastic material comprises a domed reversible return spring.

18. The keyboard unit of claim 13, wherein a second predetermined space is formed between the piezoelectric element and the base plate.

19. The keyboard unit of claim 13, wherein the piezoelectric element is arranged to form a second predetermined space below a membrane switch and bent toward the space when the key top is depressed.

* * * * *

UNITED STATES PATENT AND TRADEMARK OFFICE
CERTIFICATE OF CORRECTION

PATENT NO. : 6,700,508 B1
DATED : March 2, 2004
INVENTOR(S) : Hiroo Nomura et al.

It is certified that error appears in the above-identified patent and that said Letters Patent is hereby corrected as shown below:

Title page,
Item [73], Assignee, delete "Electronic" and substitute -- Electric -- in its place.

Signed and Sealed this

Twenty-seventh Day of July, 2004

JON W. DUDAS
*Acting Director of the United States Patent and Trademark Office*